United States Patent
Chetta et al.

(10) Patent No.: US 6,393,331 B1
(45) Date of Patent: May 21, 2002

(54) METHOD OF DESIGNING A TURBINE BLADE OUTER AIR SEAL

(75) Inventors: Gregory E. Chetta, Palm Beach Gardens; Charles A. Ellis, Stuart; Joey C. Hayes, Palm Beach Gardens, all of FL (US); Daniel E. Kane, Tolland; William D. Neff, Lebanon, both of CT (US); Joseph A. Oblak, West Palm Beach, FL (US); Susan A. Rose, Palm Beach Gardens, FL (US); Kevin L. Worley, Palm Beach Gardens, FL (US)

(73) Assignee: United Technologies Corporation, Hartford, CT (US)

( * ) Notice: Subject to any disclaimer, the term of this patent is extended or adjusted under 35 U.S.C. 154(b) by 0 days.

(21) Appl. No.: 09/212,922

(22) Filed: Dec. 16, 1998

(51) Int. Cl.$^7$ ................... G06F 19/00; G06F 17/50
(52) U.S. Cl. ................... 700/97; 700/104; 700/117; 703/1
(58) Field of Search ................... 700/104, 103, 700/98, 96, 97, 117; 703/1

(56) References Cited

U.S. PATENT DOCUMENTS

| | | | |
|---|---|---|---|
| 5,293,479 A | * 3/1994 | Quintero et al. | 345/353 |
| 5,373,973 A | 12/1994 | Foster | |
| 5,374,161 A | 12/1994 | Kelch et al. | |
| 5,455,778 A | * 10/1995 | Ide et al. | 700/182 |
| 5,609,469 A | 3/1997 | Worley et al. | |
| 5,687,094 A | * 11/1997 | Kagawa et al. | 716/5 |
| 5,799,293 A | * 8/1998 | Kaepp | 706/45 |
| 5,815,154 A | * 9/1998 | Hirschtick et al. | 345/853 |
| 5,880,959 A | * 3/1999 | Shah et al. | 700/97 |
| 5,966,310 A | * 10/1999 | Maeda et al. | 345/334 |
| 6,230,066 B1 | * 5/2001 | Sferro et al. | 700/104 |
| 6,292,763 B1 | * 9/2001 | Dunbar et al. | 703/1 |

* cited by examiner

*Primary Examiner*—William Grant
*Assistant Examiner*—Paul Rodriguez

(57) ABSTRACT

A method of designing an outer air seal for the turbine blades of a gas turbine engine utilizes a knowledge-based product model software program for generating a parametric, three-dimensional, geometric model of the air seal. The product model software program is embodied in a knowledge-based engineering system. The model is created by the program through user selection of various structural feature options available for the air seal. The product model software program uses its internal knowledge base of configuration dependent parameter relationships and rules to design the model. Various types of analyses may then be run to validate the model. The model may be changed, if necessary, as a result of the analyses. The air seal model output from the product model software program is in a file format that defines the topology and dimensions of the geometry of the air seal. Other software programs may then use this product model output file in various ways, such as to re-generate the model for use in a CAD system.

30 Claims, 11 Drawing Sheets

126

Intersegment
Intersegment style (choose one)
Select Accept! or Default! to use default "Shiplap"

- Shiplap
- Fingers

Backing Plate
Backing plate - yes or no? (choose one)
Select Default! to use default "No backing plate"
Select Accept! to use last input of "Backing plate"

- Backing plate
- No backing plate

Cooling Channels - Mid Zone
Mid Zone Configuration - qty and style (choose one)
Select Accept! to use last input of "Two Straight Channels"

- Zero
- One Straight Channel
- Two Straight Channels
- Three Straight Channels
- Four Straight Channels
- Five Straight Channels
- Six Straight Channels

Attachments - Rail, AFT
Dam feature, yes or no? (choose one)
Select Default! to use default "No"
Select Accept! to use last input of "Yes"

- Yes
- No

Attachments - Hook, AFT
Hook arrangement (choose one)
Select Default! to use default "Three Hooks, Equally Spaced"
Select Accept! to use last input of "Four Hooks, Two Closely Spaced"

- Top
- One Hook
- Two Hooks, Equally Spaced
- Two Hooks, Closely Spaced
- Three Hooks, Equally Spaced
- Three Hooks, Closely Spaced
- Four Hooks, Equally Spaced
- Four Hooks, Two Closely Spaced
- Five Hooks, Equally Spaced
- Five Hooks, Three Closely Spaced
- Six Hooks, Equally Spaced
- Seven Hooks, Equally Spaced
- Eight Hooks, Equally Spaced

FIG. 4

METHOD OF DESIGNING A TURBINE BLADE OUTER AIR SEAL

CROSS REFERENCE TO RELATED APPLICATION

The subject matter of this application is related to the subject matter of commonly owned U.S. patent application Ser. No. 09/212,923 entitled "Method of Creatng a Parametric Model in a CAD System".

TECHNICAL FIELD

This invention relates generally to computer-based methods of designing products, and more particularly to a computer-based method of designing an outer air seal for the turbine blades of a gas turbine engine.

BACKGROUND ART

An aircraft gas turbine engine generally comprises a compression section, a combustion section and a turbine section. Each section operates on the working fluid in a well-known manner to generate thrust. The compressor and turbine both comprise a plurality of airfoil blades attached to rotating disks to form rotor assemblies. The outermost radial surfaces or tips of the blades in each turbine and compressor rotor are designed to be in close proximity to a corresponding outer air seal. The air seal is part of a shroud assembly attached to the inside of the engine casing and disposed in a radial manner outward from the corresponding turbine or compressor rotor.

The clearance between the blade tips and the outer air seal is sized to reduce the performance penalty that results from air that may leak from the pressure side to the suction side of the blade. As the blade tip clearance increases, an increasing amount of air can leak over the blade tips, causing the compressor and turbine to lose efficiency. Also, the compressor can approach a stall condition, which may be catastrophic for the engine. On the other hand, it is undesirable for the blade tips be in physical contact with the outer air seal, since this could damage the blades and seal. In an effort to reduce these problems, there exist numerous embodiments of active and passive tip clearance controls.

As is well known, a relatively small yet adequate and constant amount of tip clearance must be maintained at every engine operating condition. The tip clearance can vary due to the thermal expansion of the rotors and engine casing as well as the rotational loading applied to the blades and casing. Because of the relatively greater mass of the compressor and turbine rotors compared to the engine casing, the casing experiences larger physical thermal expansion and contraction relative to the rotors, especially during transient engine operating conditions. Maintaining tip clearance is more of a problem with turbine blades than with compressor blades because of the higher turbine operating temperatures. Also, maintaining tip clearance is more of a problem for military engines than with commercial engines. This is due to the more varied and extreme engine transient operating conditions encountered by military aircraft engines.

The outer air seal typically comprises a circular ring made of a plurality of individual segments connected together. Each segment contains a number of primary physical structural features, including means for sealing between adjacent segments ("inter-segment sealing"), means for attaching each segment to the engine casing, and means for cooling each segment using, e.g., air bled from the compressor. The inter-segment sealing means typically comprises a ship lap joint that mates with a similar joint on an adjacent segment. The means for attaching each segment to the engine casing typically comprises one or more L-shaped hooks that mate with corresponding grooves in the shroud assembly. The means for cooling each segment typically comprises one or more cooling channels formed within the segment body. Outer air seals typically include other well-known structural features. Examples of outer air seals are given in U.S. Pat. Nos. 5,609,469, 5,374,161 and 5,373,973. All of these patents are assigned to the assignee of the present invention and are incorporated herein by reference.

It is known to design various products using a computer-aided design ("CAD") system, a computer-aided manufacturing ("CAM") system, and/or a computer-aided engineering ("CAE") system. For sake of convenience, each of these similar types of systems is referred to hereinafter as a CAD system. A CAD system is a computer-based product design system implemented in software executing on a workstation. A CAD system allows the user to develop a product design or definition through development of a corresponding product model. The model is then typically used throughout the product development and manufacturing process. An example is the popular Unigraphics system commercially available from Unigraphics Solutions, Inc. (hereinafter "Unigraphics").

In addition to CAD systems, there is another type of computer-based product design system which is known as a "Knowledge-Based Engineering" ("KBE") system. A KBE system is a software tool that enables an organization to develop product model software, typically object-oriented, that can automate engineering definitions of products. The KBE system product model requires a set of engineering rules related to design and manufacturing, a thorough description of all relevant possible product configurations, and a product definition consisting of geometric and non-geometric parameters which unambiguously define a product. An example is the popular ICAD system commercially available from Knowledge Technologies, Inc. KBE systems are a complement to, rather than a replacement for, CAD systems.

An ICAD-developed program is object-oriented in the sense that the overall product model is decomposed into its constituent components or features whose parameters are individually defined. The ICAD-developed programs harness the knowledge base of an organization's resident experts in the form of design and manufacturing rules and best practices relating to the product to be designed. An ICAD product model software program facilitates rapid automated engineering product design, thereby allowing high quality products to get to market quicker.

The ICAD system allows the software engineer to develop product model software programs that create parametric, three-dimensional, geometric models of products to be manufactured. The software engineer utilizes a proprietary ICAD object-oriented programming language, which is based on the industry standard LISP language, to develop a product model software program that designs and manipulates desired geometric features of the product model. The product model software program enables the capturing of the engineering expertise of each product development discipline throughout the entire product design process. Included are not only the product geometry but also the product non-geometry, which includes product configuration, development processes, standard engineering methods and manufacturing rules. The resulting model configuration and parameter data, which typically satisfy the model design requirements, comprise the output of the product model software program in ICAD from which the actual product may be manufactured. This output comprises a file containing data (e.g., dimensions) defining the various parameters and configuration features associated with each component or element of the product.

Also, the product model software program typically performs a "what if" analysis on the model by allowing the user to change model configuration and/or parameter values and then assess the resulting product design. Other analyses (e.g., a fatigue life analysis) may be run to assess various model features with regard to such functional characteristics as performance, durability and manufacturability. These characteristics generally relate to the manufacturing and operation of a product designed by the product model software program. They are typically defined in terms of boundaries or limits on the various physical parameters of each product feature. The limits have been developed over time based on knowledge accumulated through past design, manufacturing, performance, and durability experience. Essentially, these parameters comprise rules against which the proposed product model design is measured. The rules generally comprise numbers that define physical design limits or constraints for each physical product parameter. Use of these historically developed parameters, analyses, and design procedures in this way is typically referred to as product "rule-based design" or "knowledge-based design". The rules determine whether the resulting product design will satisfy the component design requirements and is manufacturable or not, given various modem manufacturing processes. The rules for a particular product design are pre-programmed into the product model software program for that specific product.

While the ICAD system provides an excellent tool for developing software product models, it is not a replacement for an organization's primary CAD system, which maintains the product model definition throughout the entire product design and manufacturing cycle. This is because the ICAD system is a KBE software development tool rather than a CAD system. For example, while the ICAD system can create a geometric model, it cannot easily create drawings based on that model or support other aspects of the design process typically provided by CAD systems. As such, for the product model created in the ICAD system to be useful throughout the entire product development process, the model must be transported into a CAD system for further manipulation.

Another inherent problem with the commercial ICAD system is that the parametric model created by the product model software program cannot be transported as a similar parametric product model into a Unigraphics CAD system. Instead, the parametric model in ICAD must be transported into Unigraphics as a non-parametric model.

Since design and manufacturing technology is always evolving, the product model imported from the ICAD system into Unigraphics will usually be enhanced with new technology design or manufacturing features. Furthermore, since it is difficult to make modifications to a non-parametric model in Unigraphics, revisions to the product model must normally be made in the ICAD system and re-imported into Unigraphics. This causes any additional features previously added in Unigraphics to be lost.

On the other hand, the Unigraphics CAD system has inherent problems in that not all of the parametric models created by Unigraphics are "standardized" within an organization or industry. Also, parametric models implemented in Unigraphics do not effectively implement a KBE system (similar to the ICAD system) that requires the model configuration and order of Boolean operations to vary according to design requirements. Also, a Unigraphics parametric model cannot be structured to provide parameter relationships that satisfy both design and manufacturing requirements.

As a result, there are instances when a product model developed solely in either the ICAD system or the Unigraphics system will suffice, even with the aforementioned shortcomings. However, there are other instances when a parametric product model developed in the ICAD system is desired to be transported as a corresponding parametric product model and utilized as such in the Unigraphics CAD system.

DISCLOSURE OF INVENTION

An object of the present invention is to provide a computer-based method of creating a parametric, three-dimensional, geometric product model of an outer air seal for the turbine blades of a gas turbine engine.

Another object of the present invention is to provide a computer-based method of creating a parametric product model in a KBE system that can be re-created as a similar parametric product model in a CAD system.

According to a first aspect of the present invention, a method of designing an outer air seal for the turbine blades of a gas turbine engine utilizes a knowledge-based product model software program for generating a parametric, three-dimensional, geometric model of the air seal. The product model software program is embodied in a KBE system. The resulting product model may implement many different configurations of the structural features of the air seal. The product model is created by the program through user selection of various structural feature options available for the air seal. The product model software program uses its internal knowledge base of configuration dependent parameter relationships and constraints or rules to create a parametric, three-dimensional, geometric model of the air seal. The internal knowledge base is pre-programmed into the product model software program. Various types of durability, performance and manufacturability analyses may then be run on features of the product model to validate the model. The model may be changed, if necessary, as a result of the analyses. The air seal model output from the product model software program is in a file format that defines the configurations and dimensions of the geometry of the air seal. Other software programs may then use this product model output file in various ways. The product model software program also creates a design report and a non-parametric geometry model.

According to a second aspect of the present invention, the geometric specific information regarding the product model of the outer air seal is output in file format from the product model software program into a computer program. The program generates a parametric, three-dimensional, geometric model of the outer air seal that can be used by a CAD system. The program generates the model using a library of various standardized physical features of the outer air seal. This library of features resides in the workstation file system. Once the parametric model is generated, the CAD system operates on the model, allowing the user to manipulate the model in various ways not available to the user in the product model software program implemented in the KBE system. The CAD system allows the user to rapidly make changes to the parametric model without having to return to the product model software program.

The above and other objects and advantages of the present invention will become more readily apparent when the following description of a best mode embodiment of the present invention is read in conjunction with the accompanying drawings.

BRIEF DESCRIPTION OF DRAWINGS

FIG. 2, which includes

FIG. 4 is an illustration of an exemplary graphical user interface displayed to the user of the product model software program and which facilitates entry by the user into the program of desired selections for the various physical features of the model of FIG. 1;

BEST MODE FOR CARRYING OUT THE INVENTION

Referring to the figures in general, in an exemplary embodiment of the broadest scope of the present invention, the invention generally comprises a method embodied in a knowledge-based, product model software program that creates a model of an outer air seal for the turbine blades of a gas turbine engine. The resulting product may then be manufactured from the model. The product model software program may preferably be embodied in the aforementioned ICAD system, commercially available from Knowledge Technologies, Inc., and operating within a workstation, such as that available from Sun Microsystems or Silicon Graphics. The method of the present invention enables the rapid creation and manipulation of a parametric, three-dimensional, geometric model of one of a plurality of similar segments of the air seal. The outer air seal comprises a plurality of segments connected together.

During program operation, the user enters configuration and parameter data regarding various structural features of the air seal segment. This information is typically entered using a keyboard or mouse associated with the workstation. The user is guided by graphical user interfaces ("GUIs") containing information provided on a visual display screen associated with the workstation. The product model software program compares the input design information against a knowledge base of information stored as part of the program. This determines whether any design constraints have been violated which would cause the air seal to not satisfy the design requirements or be non-producible using modern manufacturing techniques. If so, the model is invalid. The information comprises a pre-programmed knowledge base of configuration dependent parameter relationships and rules regarding acceptable durability, manufacturing and performance design limits for the segment. The visual model may then be manipulated by changing various parameters or attributes associated with corresponding components of the segment.

The product model software program may also perform a fatigue life analysis on an attachment portion (e.g., a hook) of the segment model. Features of the model may be changed, depending upon the results of the analysis. Once creation of a valid model is complete, the product model software program outputs a file containing model configuration and parameter data. Other computer programs may then use this output file in a desired manner (such as for re-creating the model in a CAD system), as described in detail hereinafter with respect to an exemplary embodiment of an additional aspect of the present invention. The product model software program also creates a design report and a non-parametric geometry model.

Figure 1:
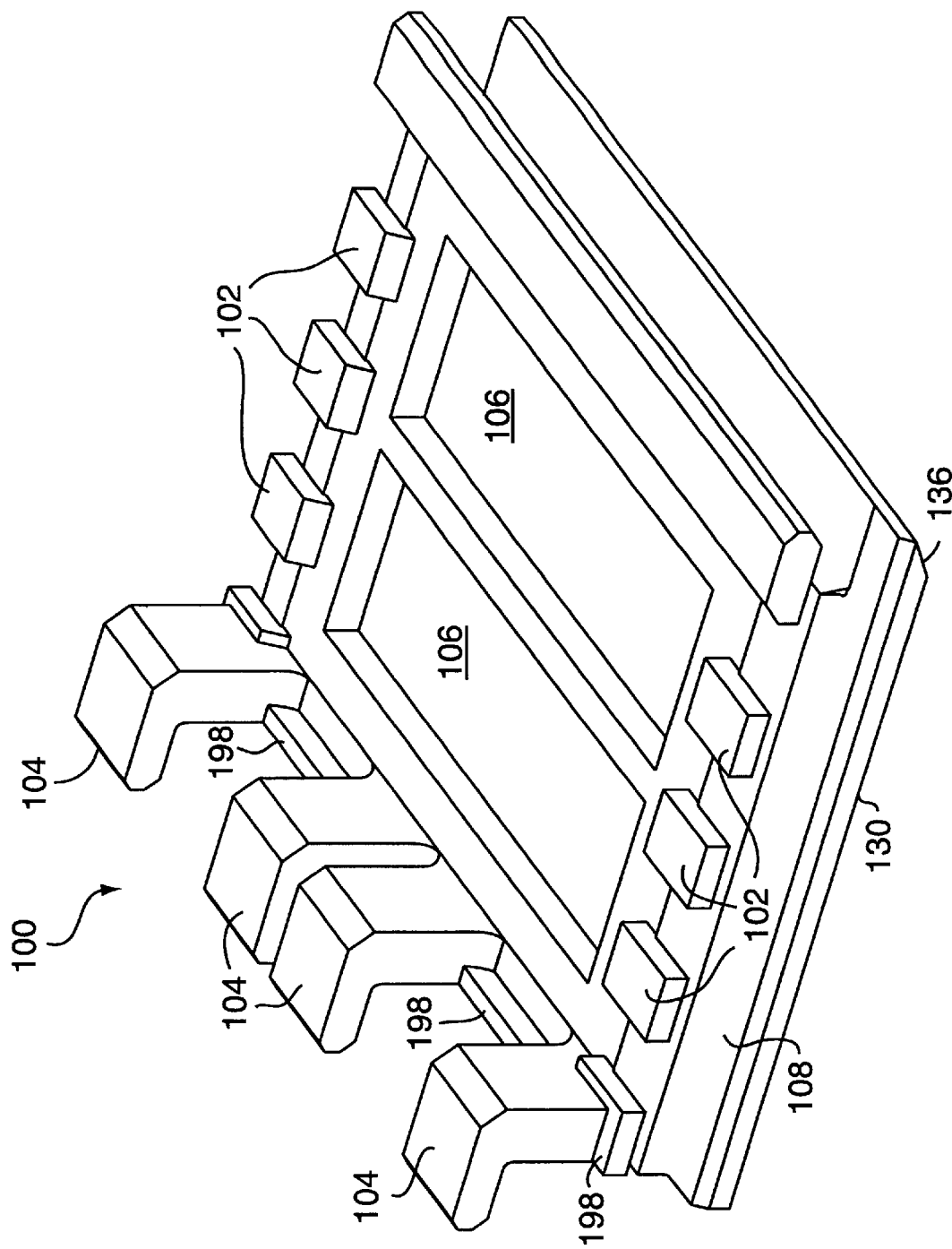
FIG. 1 is a perspective view of a model of a segment of an outer air seal, the model being created by the product model software program of FIG. 2, in accordance with the method of the present invention.

FIG. 1 illustrates an exemplary embodiment of a model of a segment 100 of an outer air seal for the turbine blades of a gas turbine engine (not shown). The segment model 100 may be designed using the method of the present invention. The segment 100 may be similar to that described and illustrated in the aforementioned U.S. Pat. No. 5,609,469, which has been incorporated herein by reference. The segments 100 are typically connected together and to the inside of an engine casing (not shown) in a well-known manner.

Each segment 100 contains a number of distinct physical structural features that may be designed into the corresponding segment model by the product model software program, in accordance with the broadest scope of an exemplary embodiment of the present invention. These features include, without limitation, the inter-segment sealing means, the means for attaching each segment to the engine casing, and the means for cooling each segment.

In FIG. 1, the inter-segment sealing means comprises a ship lap joint 102 that mates with a similar joint on adjacent segments 100. The means for attaching each segment to the engine casing comprises four L-shaped hooks 104 that mate with the corresponding grooves in a seal (not shown) of the casing. The means for cooling each segment comprises two cooling channels formed within the body of substrate 108 of each segment 100. Other types of known structural features of the outer air seal are contemplated by the broadest scope of the method of the present invention, as described hereinafter.

Figure 2A:
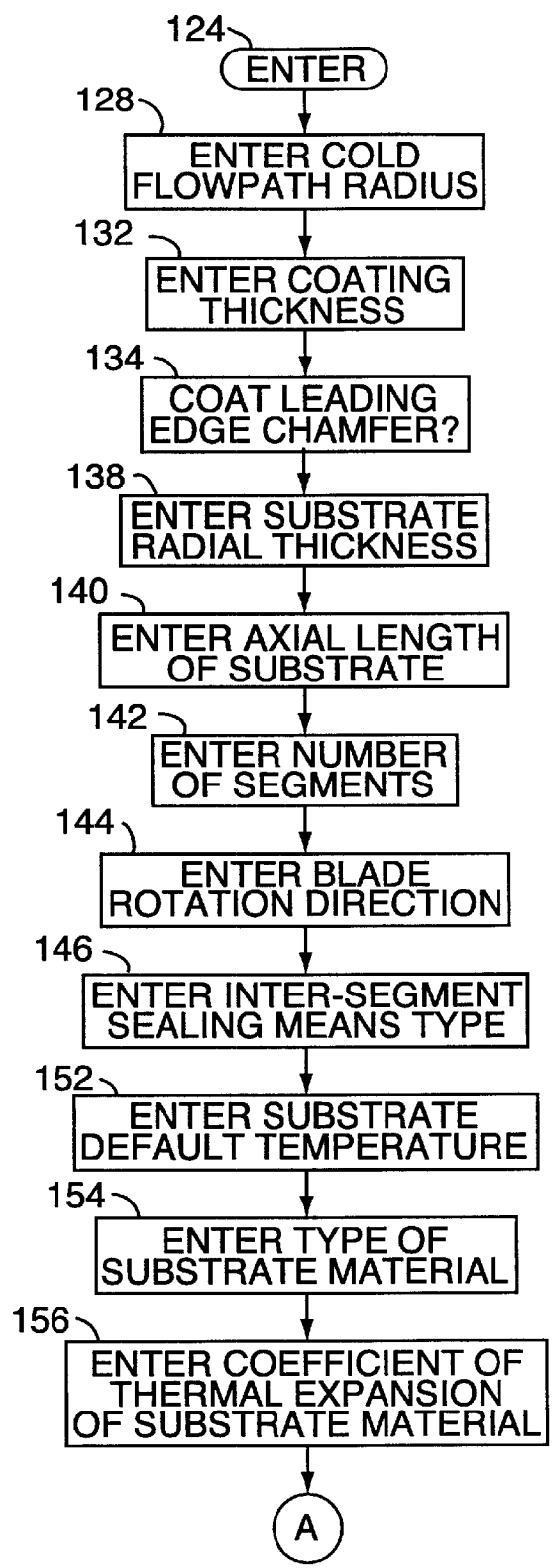
FIGS. 2a–2c, is a flow chart of steps performed by the product model software program in creating the model of FIG. 1, in accordance with the method of the present invention.
Figure 2B:
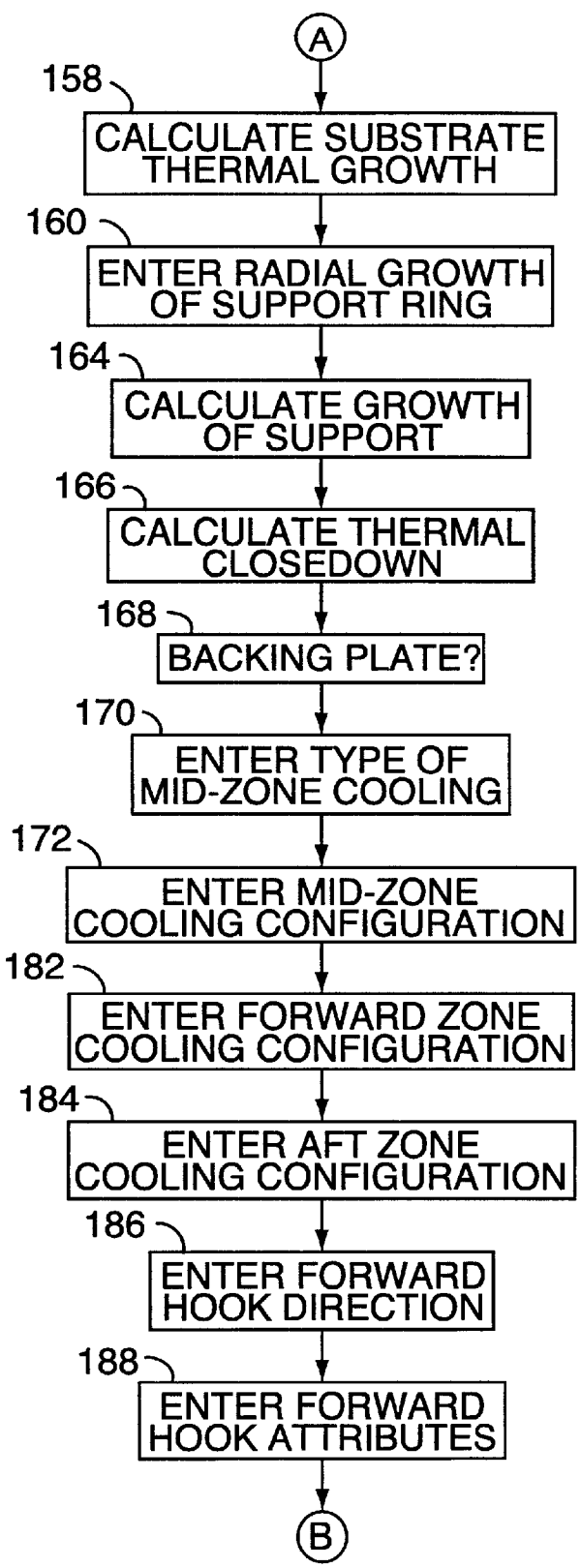
Figure 2C:
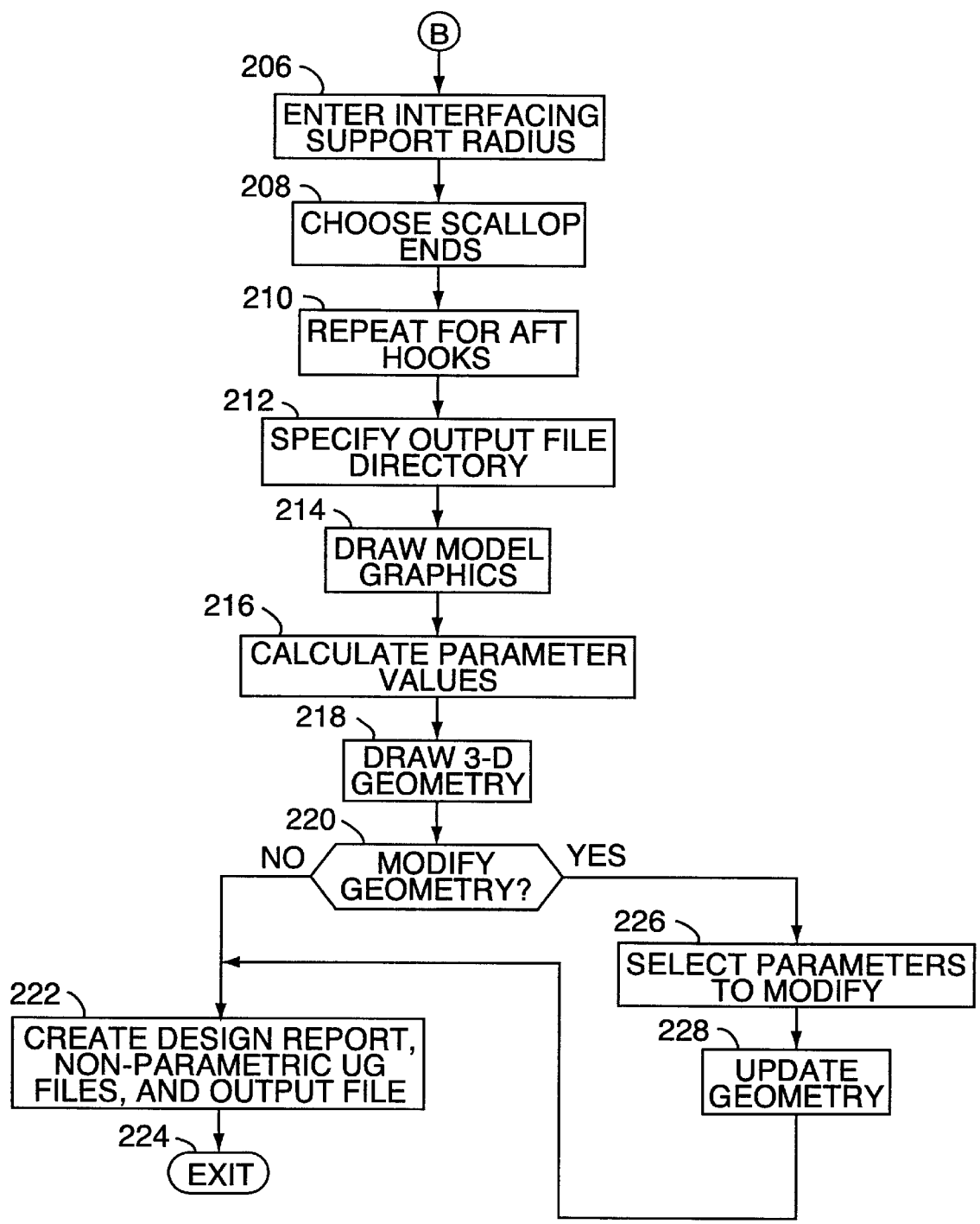
Figure 3:
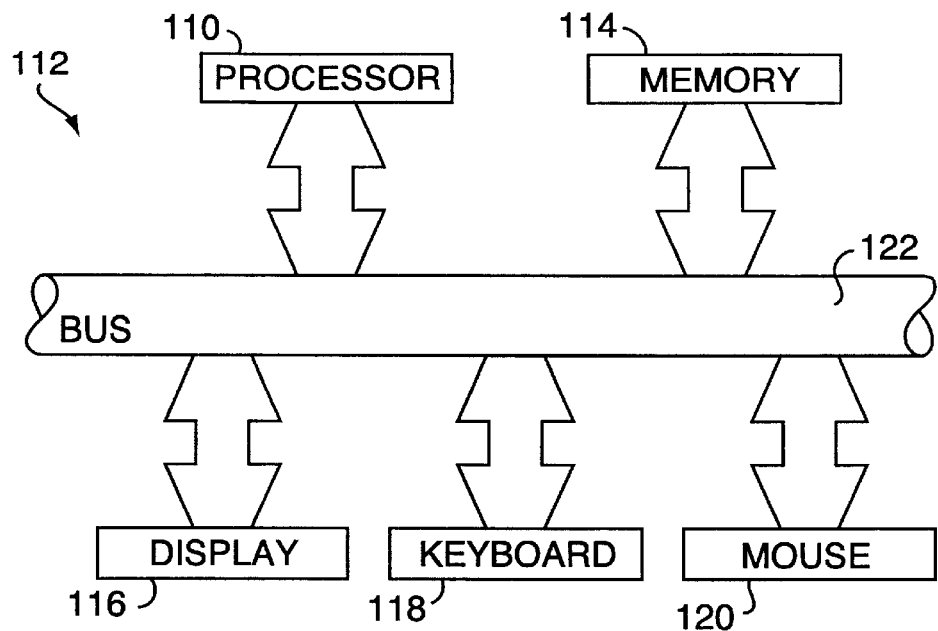
FIG. 3 is a block diagram of a workstation within which the program of the FIG. 2 is implemented.

Referring to FIG. 2, there illustrated is a flow chart of steps performed by an exemplary embodiment of a product model software program in creating the segment model. The program code is preferably written in the proprietary ICAD object-oriented programming language, which is based on the industry standard LISP language. The program code executes on a computer processor 110 within a workstation 112, such as that illustrated in FIG. 3. The workstation 112 may also contain a memory 114 for storing program code and calculated data, a visual display screen 116 for displaying various information to the user along with the model of segment 100 after it has been created, and a keyboard 118 and a mouse 120 that are both used to input information to the processor 110 and memory 114. These various devices are connected together by a bus 122.

After an enter step 124 in the flow chart of FIG. 2, the user enters a number of dimensional values with respect to various interface characteristics or physical attributes of the segment substrate 108 (FIG. 1). These dimensions are used by the program at various points during program execution in creating the model of segment 100. Throughout program execution, various GUIs, such as the GUI 126 of FIG. 4, guide the user while entering data and information. These GUIs 126 display various model configuration and parameter data value selections to the user, and the user selects a desired default data value, or enters a desired data value, using the keyboard 118 or mouse 120.

In a step 128, the user enters a value for the cold flow path radius of the substrate 108. This is the radius of curvature of the bottom surface 130 (FIG. 1) of the substrate including a coating applied to that surface. As is common for each interface dimension (and for other types of parameter inputs, described hereinafter), the user may enter a desired value, or the user can select a default value offered to the user on the GUI. The default values are part of the knowledge base of parameters related to the outer air seal segment whose values are pre-programmed into the product model software program. Besides default values for parameters or attributes, the knowledge base may also contain constraints on parameter inputs. These constraints and default values may comprise either a single value or range of values. For example, a parameter value may be greater than or less than a certain value. Also, the constraints and defaults may be derived from mathematical equations. A constraint or default value can either be dependent or independent of other parameters.

The present invention contemplates that one of ordinary skill in the art will include someone with skill in designing outer air seals for gas turbine engines. Thus, the various attributes or parameters of an outer air seal segment 100, together with the values for these parameters, should be readily apparent to someone with such skill. Nevertheless, where appropriate, a discussion of various air seal segment parameters or attributes, together with the manner of deriving certain default or derived values for these parameters, is provided herein.

The user next enters, in a step 132, a value for the thickness of a coating applied to the bottom surface 130 of the substrate 108. The user then chooses, in a step 134, whether or not the coating should cover a chamfer 136 (FIG. 1) formed on the leading edge of the substrate 108. If yes is selected, the coating will cover the substrate inside diameter (bottom surface 130) and the leading edge chamfer 136. If no is selected, the coating will over only the substrate inside diameter 130. Next, the user enters, in a step 138, a value for the radial thickness of the substrate 108. Again, the user may either enter a desired value, or the user may choose from a default value of, e.g., 0.085 inches. Finally, with regard to the substrate 108, the user enters, in a step 140, the axial length of the substrate, as measured along the engine centerline axis. Typically, flow path information is used to calculate this length.

It should be understood that these substrate interface dimensions, and their order of entry into the program, are purely exemplary. Instead, as should be readily apparent to one of ordinary skill in the art, other substrate interface characteristics may have their dimensions input in various orders by the user. For example, these other characteristics include the gaps between the leading and trailing edges of the substrate 108 and the corresponding forward and aft interface portions on the shroud assembly (not shown). Also included may be the angle of the chamfer 136 on the leading edge of the substrate, together with the resulting thickness of the nose portion of the substrate 108 at the substrate leading edge.

Next, in a step 142, the user enters the number of segments 100 comprising the entire outer air seal. A typical default value is thirty-six segments. The user then enters, in a step 144, the direction of turbine blade rotation (clockwise or counter-clockwise) when looking forward along the engine axial centerline. The direction of rotation determines the orientation of inter-segment geometry features.

The user next enters, in step 146, the type of inter-segment sealing means. It is common in the art to use either a ship lap joint 102 or a finger style joint. Regardless, each style has a number of physical attributes entered by the user into the program, typically by default. The program may prompt the user to enter values for these attributes or parameters at this point in the program, or at a later point in the program. Some of these attributes are common to both styles, while some are unique to only one style. Also, some of the attributes depend on the style of the inter-segment sealing means employed by adjacent segments. Generally, these attributes deal with dimensions associated with the various structural features of each style of inter-segment sealing means, such as axial and radial distances, gaps, radii, thickness, widths, lengths, depths, clearances, angles, and amounts of overlap.

Figure 5:
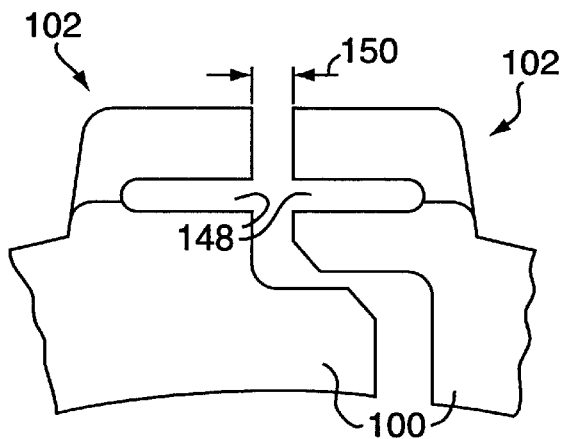
FIG. 5 is an illustration of a portion of two adjacent segments each having a first type of inter-segment sealing means.
Figure 6:
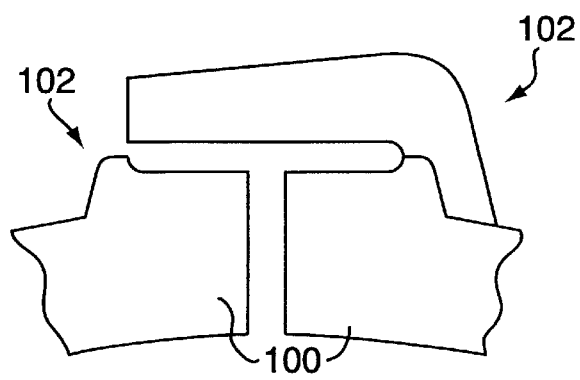
FIG. 6 is an illustration of a portion of two adjacent segments each having a second type of inter-segment sealing means.

For example, FIG. 5 illustrates a portion of each of two adjacent segments 100, wherein each segment has a ship lap joint 102 style of inter-segment sealing means. On the other hand, FIG. 6 illustrates the two adjacent segments 100 each having a finger style of inter-segment sealing means. In FIG. 5, each ship lap joint 102 includes a feather seal 148 that extends between adjacent segments to prevent leakage between segments. The various programmed knowledge base attributes associated with the adjacent ship lap joint 102 of FIG. 5 include the dimensions that correspond to the various physical features of each ship lap joint (including the feather seal 148), together with the dimensions that correspond to the mating of two adjacent ship lap joints. For example, the inter-segment gap 150 between two adjacent segments 100 at the radial location of the feather seal slot is typically a default value that depends upon a calculated value for the inter-segment thermal closedown added to an inter-segment machined dimensional tolerance. Also, attributes unique to each joint are pre-programmed into the knowledge base. As mentioned above, the values of these attributes typically comprise those relating to various radii, clearances, thickness, lengths, depths, widths, etc. These attribute values should be apparent to one of ordinary skill in the art.

Returning to the flow chart of FIG. 2, the user next enters, in a step 152, a default temperature for the substrate 108. This temperature is used in a subsequent step to calculate the substrate circumferential thermal growth. The user then enters, in a step 154, the type of substrate material, and the user enters, in a step 156, the coefficient of thermal expansion of the substrate material. This value is typically a default value, based on the substrate material. The program then calculates, in a step 158, the default value for the substrate thermal growth. This calculation is based on the substrate coefficient of thermal expansion, the default substrate temperature, and the circumferential length of the substrate. The substrate circumferential length depends upon the substrate inner radius and the number of segments 100 comprising the entire outer air seal.

Figure 8:
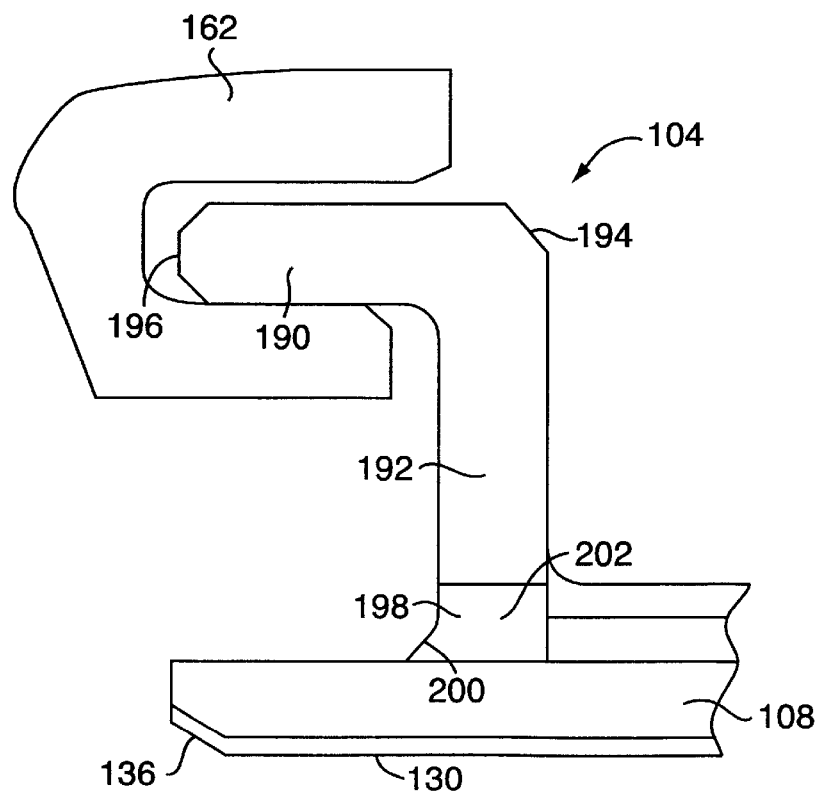
FIG. 8 is a side view of the segment substrate illustrating the relationship of a hook to a support ring that is part of the engine casing.

The user then enters, in a step 160, a value for the radial growth of the support ring 162 (FIG. 8). The support ring 162 interfaces the outer air seal to the engine outer casing. The value chosen should come from a thermal/structural analysis of the support ring 162. Next, the program calculates, in a step 164, the circumferential growth of the support ring 162. The program calculates, in a step 166, the inter-segment thermal closedown, which sets the gap 150 (FIG. 5) between adjacent segments 100. This value represents the thermal reduction of the inter-segment gap due to the circumferential growth of the segments 100 relative to the circumferential growth of the support ring 162.

Next, the user selects, in a step 168, whether a backing plate exists or not. The backing plate seals off any exposed cooling channels 106 formed in the substrate 108. Typically, no backing plate is utilized (i.e., the cooling channels 106 are formed entirely within the substrate body). The user may enter values for a number of different structural features or attributes of the backing plate. These include its axial length, circumferential length, thickness, and inner radius, along with various parameters regarding a tab formed integral with the backing plate. Some or all of these parameter values may be default values.

The user then chooses, in a step 170, the type of cooling channels 106 disposed in the approximate center or mid-zone of the segment 100. The user can typically choose between an impingement design and a super convectively cooled design. The impingement design is an open channel that may require a backing plate welded to the channel ledge to enclose the channel(s). The super convectively cooled design has channels 106 that may either be cast open and then closed by a backing plate, or the channels may be fully enclosed within the casting.

Once the type of mid-zone cooling method has been chosen, the user then enters, in a step 172, the quantity and shape of the mid-zone cooling channels 106. The options available depend upon whether the impingement or super convectively cooled design was chosen. For example, the mid-zone channel shape is straight (FIG. 1) for impingement cooling and straight or tapered for super convectively cooled. Also, tapered channels need to occur in pairs.

Similar to the other major structural features of the segment model, the product model software program of the present invention stores (as part of its knowledge base for the air seal segment model) a number of default values for various attributes of the midzone cooling channels 106. These attributes include various depths, thickness, widths, widths, lengths, radii, clearances, orientations and ratios. All of these attributes are measured from various points on the segment 100. Also, some attributes or parameters depend upon the values of attributes associated with other structural features of the segment (e.g., a hook attachment, described in detail hereinafter, or a backing plate).

Figure 7:
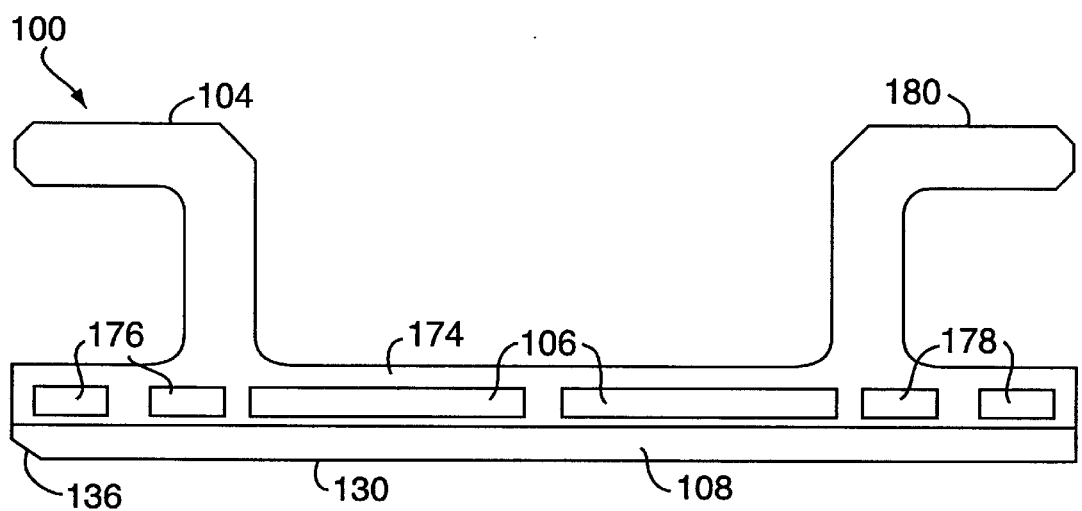
FIG. 7 is a cross-section of a segment having cooling channels formed therein.

For example, FIG. 7 is a cross-section view of a segment 100 having enclosed midzone cooling channels 106 (i.e., either impingement cooling with a backing plate 174 or super convectively cooling). This figure illustrates the position of the channels 106, including forward cooling channels 176 and aft cooling channels 178, relative to the overall configuration of the segment, including hooks 104, 180 as forward and aft attachment means, respectively. From this figure and FIG. 1, various types of dimensions of the cooling channels 106, 176, 178 relative to other structural features of the segment 100 may be readily discerned (e.g., the distances of various points of the cooling channels from the leading and trailing edges of the substrate 108).

Still referring to FIG. 7, the user then enters, in a step 182, the quality and style of the cooling zones or channels 176 for the forward portion of the segment 100. Optionally, the forward portion may have serpentine, straight or tapered channels. This portion of the segment 100. Similar to the default values for various attributes associated with the mid-zone cooling channels 106 described above, the cooling zones 176 for the forward portion of the segment model have a number of default values associated with various similar attributes. Included are those attributes that depend upon the type of channel configuration chosen (e.g., straight, tapered, serpentine). Others include the depth of the channels above and below various surfaces of the substrate 108.

In a similar manner, the user, in a step 184, then enters the quantity and style of the cooling channels 178 for the aft portion of the segment [model] 100. The aft zone has similar default values as those associated with the forward and mid-zones (i.e., straight, tapered or serpentine channels). If a serpentine channel is employed for the forward or aft portion of the substrate, one such serpentine channel will actually create two channels connected at one end with a U-shaped connector. Also, the serpentine channel will have its own associated attributes, such as which side of the substrate the U-shaped connector is on, the radius of curvature of the channel, and how far from the outer edge of the serpentine channel is the center rib.

Referring to FIG. 8 together with FIG. 1, the user next enters, in a step 186, the facing direction (either forward or backward) for the hooks 104 that comprise the forward means for attaching the segment 100 to the engine casing. FIG. 8 is a side view of a forward hook 104 showing its relationship to the support ring 162 that is part of the engine casing. If there is more than one hook 104, 180 on either side of the substrate 108, typically all the hooks on that side either face forward or backward, due to manufacturing constraints. FIG. 1 illustrates four hooks 104 on the forward side of the segment 100, and one continuous hook 180 on the aft side. The forward hooks 104 may face inward or outward as a group regardless of whether the aft hook(s) 180 are facing inward or outward.

The user then enters, in a step 188, various attributes regarding the desired arrangement of the forward hooks 104. For example, the user enters the number of hooks together with the type and amount of spacing between the hooks (e.g., equal spacing). As with the other structural features described herein before, the forward hooks 104 may have a number of default values for various hook attributes pre-programmed into the knowledge base for the product model software program of the present invention. As with the attributes for other segment elements, these default values may be either numerical values or mathematical equations that define the default values. Referring to FIG. 8, these attributes include the thickness of the foot portion 190 and leg portion 192 of the hook, the amount of chamfer on the heel portion 194, the amount of various chamfers on the toe portion 196, the length of the foot and leg portions 190, 192 of the hook, and the amount of load that each hook will be required to bear.

The various attributes associated with the forward hooks 104 also include those relating to a rail 198 that is formed integral with the hooks 104. Referring to FIG. 8, those attributes include a rail extension 200 and a dam feature 202 associated with the rail 198. The rail extension 200 may exist independently of the dam feature 202. The dam feature is installed on the outboard top edge of the rail and will appear between each scallop 204 (FIG. 1). The scallops 204 are described in detail hereinafter. Various attributes of the dam 202 include its height and width. Various attributes of the rail 198 include whether it has an outward extension 200 or not. FIG. 8 illustrates the rail 198 without an extension. Other rail attributes include the height and width of the rail extension (if any), the height and width of the rail, the axial offset of the rail/leg outboard face from the substrate outer edge, the fillet radius between the inboard face of the dam 202 and the top of the rail 198, and the fillet radius between the outboard face of the rail and either the rail extension or the substrate outer radius.

The user, in a step 206, then enters a value for the interfacing support radius. This sets the inner radius of the foot portion 190 of the hook 104 and represents the point on the foot portion where the hook load is applied when the hook is connected to the support ring 162. Generally, the value for this radius must be larger than the substrate outer radius.

The user next chooses, in a step 208, whether the hooks 104 will have scalloped type ends. If so, then typically a number of default values for the various physical attributes associated with the scallops 204 are utilized. For example, referring to FIG. 1, when the user selects the number of hooks 104 this also determines the number of scallops. The hook circumferential width will change according to the number of scallops. The arrangement of scallops should always be symmetrical. Other user-selectable scallop attributes include whether or not the radial ends of the segment 100 will have scallops. FIG. 1 illustrates the radial ends without scallops. Also, included are the width, depth, and fillet radius of the scallops. The user may also select whether some of the hooks will be primary load-bearing hooks that bear more load than secondary load-bearing hooks. This typically affects the spacing between the scallops.

Finally, the program, in a step 210, repeats the previous four steps 186, 188, 206, 208 with respect to the attachment means (e.g., one or more hooks) 180 located at the aft edge of the segment 100. The dimensional considerations for attributes associated with the aft hooks 180 are similar to those previously described for the forward hooks 104.

At this point, the user has completed entering the configuration and parameter data relating to the various structural features of the outer air seal segment 100. Next, in a step 212, the user specifies the directory for the output files that are created by ICAD when it has completed creating the model of segment 100. The user, in a step 214, then issues a command to the ICAD system to start drawing the graphical illustration of the segment 100. The program then commands the ICAD system to calculate, in a step 216, the parameter values for the geometric features of the model of segment 100. These values are calculated from the user-entered configuration and parameter data, and from the stored default values and rules relating to various physical limits placed on the data values.

After the parameter values have been calculated, the program commands the ICAD system to draw, in a step 218, the three-dimensional model of the outer air seal segment 100 and displays the model to the user on the visual display screen 116 of the workstation 112. The ICAD system creates a valid, parametric, three-dimensional, geometric model of the segment 100 using the user-input data verified against the knowledge base of configuration-dependent parameter relationships and constraints stored in the product model software program of the present invention. The ICAD system inherently contains a number of common geometric primitives (e.g., a cylinder) that the product model software program utilizes in creating the model. These primitives are inherent in the sense that they reside in the ICAD system apart from the product model software programs. As such, the primitives do not have to be pre-programmed into the product model software program. However, the product model software program contains the rules that relate a primitive or combination of primitives to a geometrical feature of the air seal segment.

In further accord with the present invention, the product model software program for the air seal segment 100 then checks, in a step 220, whether the user wants to modify any portion of the geometry of the model of segment 100. This can be done any time after the model geometry has been created by ICAD system. If the user decides not to modify the geometry, the user issues a command, in a step 222, for the ICAD system to create the aforementioned design report, various non-parametric Unigraphics files, and an output file. The program then ends in a step 224.

The output file serves as an input to another computer program described in detail hereinafter with respect to an additional aspect of the present invention. The file contains geometric configuration and parameter data relating the various elements of the segment model. This data is a listing of the attributes for each model feature, together with the assigned numerical value for each attribute. The file also contains the "import" operator for each feature and the Boolean operator (e.g., "unite", "subtract", "intersect") that is to be performed by this additional program on each corresponding feature to incorporate that feature into the overall model of segment 100.

The design report is a text file that lists the various parameters relating to the physical features or elements of the model of segment 100 along with the values assigned to those parameters by the program (including both user-selected parameter values and pre-programmed default parameter values). The report lists geometric information about the model of segment 100 in terms of parameter values for each feature.

If the user wants to change the model geometry, the user commands the ICAD system to do so. In a step 226, the user selects the specific segment model parameters to change; after the user has reviewed a menu listing the various revision options available. When changing the various segment features, the program advises the user if any design rules have been violated such that the segment may not be able to satisfy design requirements. The program then makes the allowable changes to the model in a step 228, and the resulting visual model may then be viewed and further modified, if desired. Once the user is satisfied with the resulting, completed segment model, the step 222 is then executed where the design report, Unigraphics files, and the output file are created. The program then ends in the step 224.

After the ICAD system has created the segment model in the foregoing steps, the ICAD system allows the user to perform various types of engineering analyses on the model design to assess various performance features of the design. For example, the user may perform a fatigue life stress analysis on the foot portion of a hook that forms a part of the means for attaching the segment to the engine casing. In this way, the user can assess the durability of the design chosen for the foot portion of the hook.

Figure 9:
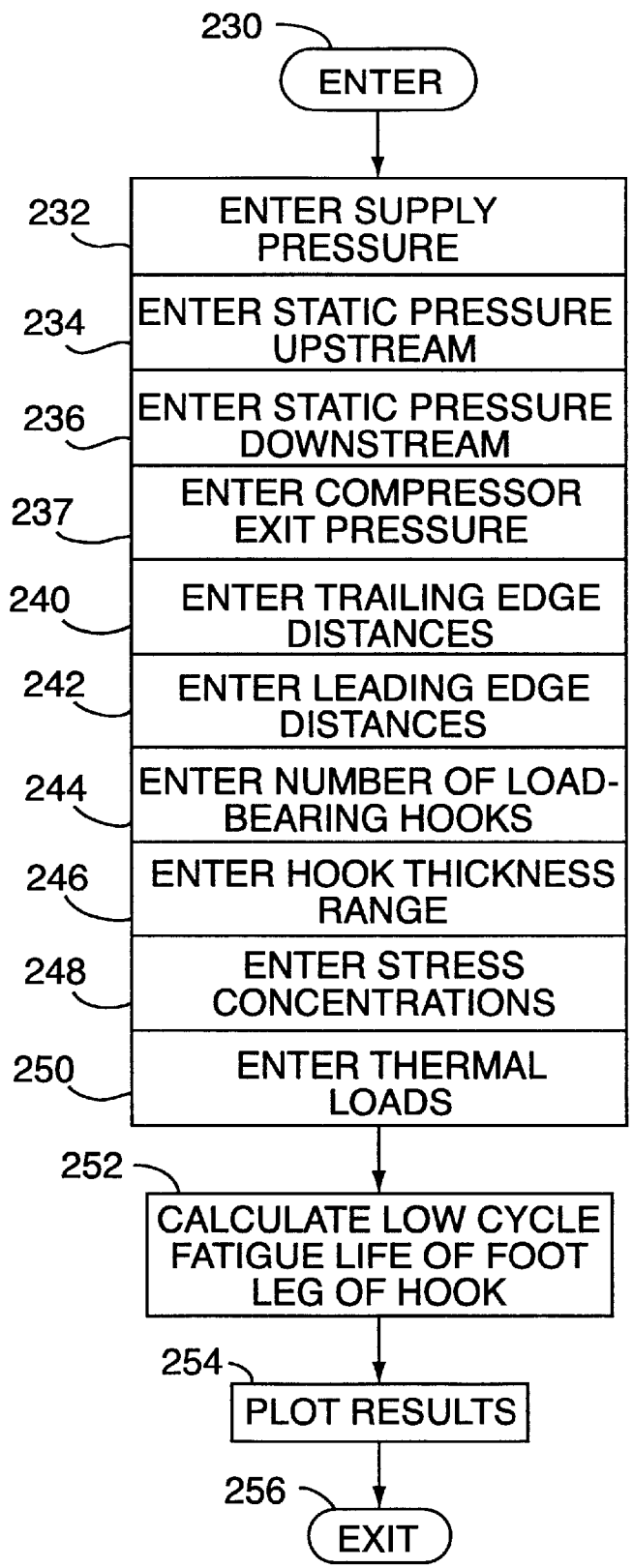
FIG. 9 is a flow chart of steps performed by the product model software program in performing an exemplary fatigue life analysis of the segment model of FIG. 1.

Referring to FIG. 9, there illustrated is a flow chart of steps executed by the product model software program in carrying out a life analysis of the foot portion 190 (FIG. 8) of the hook 104. After an enter step 230, the user enters various parameters that the foot life program will use in its calculations. Specifically, the user, in a step 232, enters a value for the supply pressure as a percentage of the exit pressure of the engine compressor (not shown). Next, in a step 234 the user enters a value for the static pressure upstream of the turbine blade (not shown) as a percentage of compressor exit pressure. The user then enters, in a step 236, a value for the static pressure downstream of the blade as a percentage of compressor exit pressure. The user then enters, in a step 238, the compressor exit pressure.

Next, the user enters, in a step 240, the distance from the segment substrate 108 trailing edge to the blade trailing edge. The user then enters, in a step 242, the distance from the substrate leading edge to the blade leading edge. Next, the user enters, in a step 244, the number of hooks 104, 180 that are considered to be load bearing. The user then enters, in a step 246, the desired thickness range that both the foot and leg portions 190, 192 of the hook 104 can assume during the parametric analysis. Next, the user enters, in a step 248, the stress concentration factor for the hook. Finally, the user enters, in a step 250, the thermal load on all load-bearing hooks.

Once these parameters have been entered, the foot life analysis program calculates, in a step 252, the low cycle fatigue life of the foot and leg portions 190, 192 of the hook 104 for the parametric range of thickness and percent load distances. These calculations are based on the fact since the loads on the hook 104 have been selected earlier in the program of FIG. 9, and the geometry of the modeled hook 104 is known, then a relatively simple, known stress analysis can be performed to determine the fatigue life of the hook 104. Next, a plot program may be invoked, in a step 254, to display the graphical results of the fatigue life analysis. The analysis program then ends in a step 256. A similar analysis may be run on other elements of the model of segment 100.

According to an additional aspect of the present invention, the file that is output from the ICAD system file may then be input into another computer program. This ICAD system file contains a listing of the outer air seal segment 100 geometric configuration and parameter data, together with the corresponding Boolean operations (i.e., the segment model update commands of "unite", "subtract" and "intersect"). These operations integrate the data into the air seal segment model that will reside in Unigraphics CAD system. This file is an output from the product model software program of FIG. 2. The additional program hereinafter referred to as "PWMODEL" essentially functions as an interface between the ICAD system and the Unigraphics CAD system. The functionality of this PWMODEL program comprises the additional aspect of the present invention.

In a preferred, exemplary embodiment, PWMODEL is an object-oriented program implemented in the popular C++ software language as a Unigraphics user-function program. As used herein, the term "object-oriented" refers to a computer program that is organized as a collection of discrete objects that incorporate both state and behavior. As is well known, in a functional-based computer program such as PWMODEL, the state and behavior are loosely connected. State diagrams for several aspects of PWMODEL are included herein and described in detail hereinafter. The state diagrams assist in understanding the PWMODEL program and in describing the underlying dynamic functionality of the program.

Both PWMODEL and the Unigraphics CAD system may be implemented within the same workstation 112 as that of the ICAD system. Specifically, PWMODEL uses the ICAD system segment model geometric data and commands to generate, or recreate, a similar parametric model of the air seal segment 100 that is used within Unigraphics. This is done to overcome the inherent shortcomings (i.e., the incompatibilities between the ICAD system and the Unigraphics CAD system) of each system discussed above in the "Background Art" section.

PWMODEL generates the parametric segment model in Unigraphics using a library of various standardized physical features of the air seal segment. This library of geometric features is pre-programmed into Unigraphics (i.e., the workstation file system). This is similar to the knowledge base of information about the air seal being preprogrammed into the ICAD system.

In a general description of PWMODEL (with a more detailed description provided hereinafter), PWMODEL begins processing by reading the input file and storing the necessary information therefrom. Then, an environment variable is accessed to determine the location directory within the workstation file system of the feature library of Unigraphics parts for the particular product. Next, a standard Unigraphics part file is opened and the program begins creating the parametric product model. The model configuration data from the input file is processed and the features are imported, one at a time, and on successive layers, from the feature library and into the Unigraphics part. After each feature is imported, parameter information from the input file is used to update the feature model. This cycle continues until all model configuration information from the input file has been processed.

Once PWMODEL generates the parametric segment model, Unigraphics may operate on the model, allowing the user to manipulate the model in ways not available to the user in the product model software program implemented in the ICAD system. For example, Unigraphics provides the user with drawings of the model, from which the end product may be more readily manufactured. More importantly, Unigraphics allows the user to rapidly make changes to the parametric model within Unigraphics. Thus, the user does not have to return to the product model software program in the ICAD system to make such changes to the model.

Figure 10:
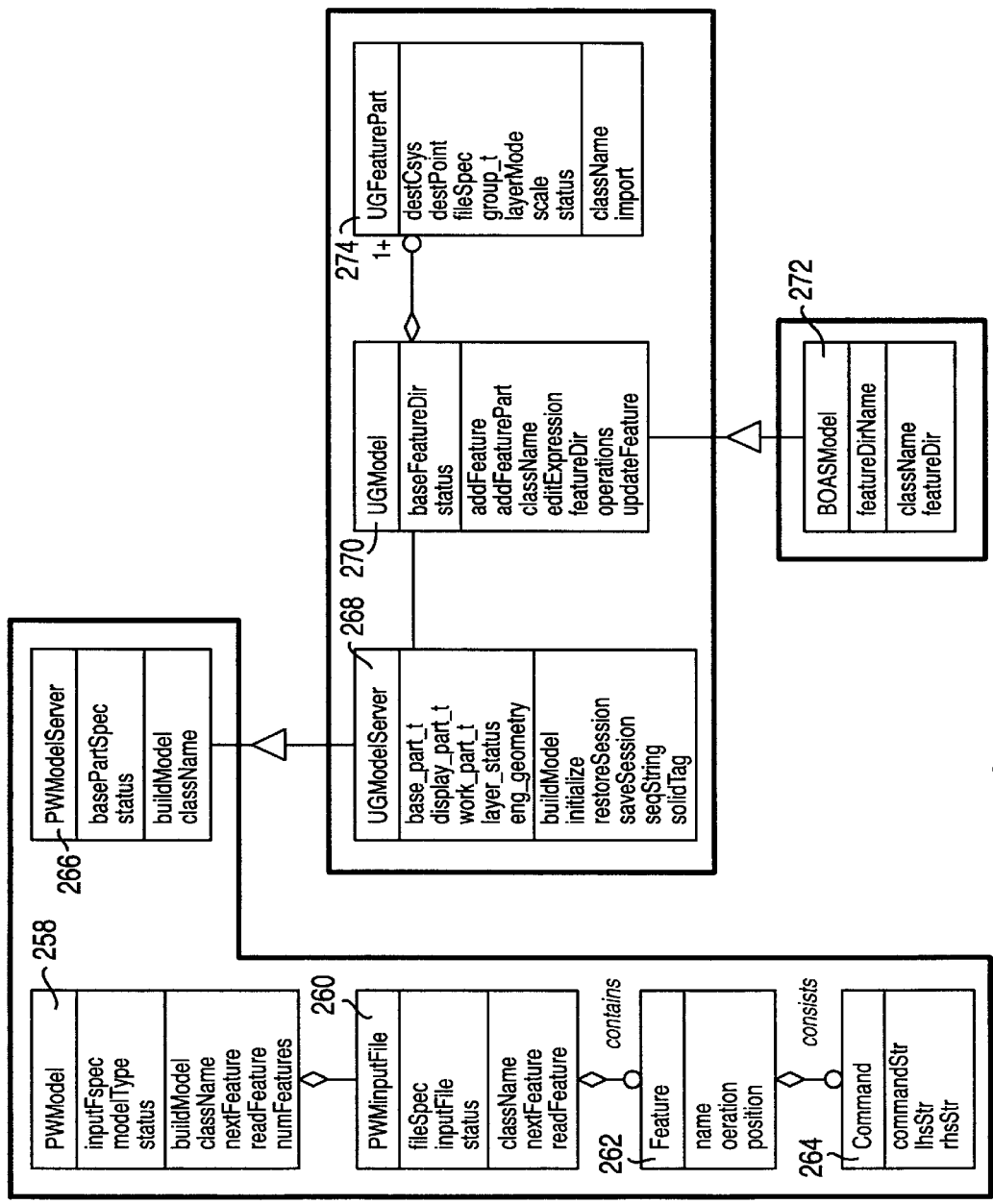
FIG. 10 is an object model diagram of the various classes comprising a computer program in accordance with a second aspect of the present invention, wherein the computer program acts on the segment model produced by the program of FIG. 2 to generate a parametric model of the air seal.

Referring to FIG. 10, there illustrated is a static object model diagram of PWMODEL. This well-known type of software structural diagram depicts the nine classes that comprise PWMODEL in an exemplary embodiment thereof Such an object model diagram is essentially a blue print of the classes from which the objects of the segment model are created. The diagram also sets forth the attributes and methods that belong to each class. As is well known, the methods are behaviors that determine the operations performed on the corresponding attributes within each class.

In FIG. 10, "PWModel" is the first class 258 illustrated therein. This class 258 accepts a model type (e.g., outer air seal segment) and an input file name and constructs a fully parametric CAD solid model. The attributes of this class include: "inputFspec", which is the name of the input file specified by the user; "modelType", which specifies the type of parametric model to create; and "status", which indicates the error status of the "PWModel" class. The methods within this class include: "buildModel" which builds the desired standardized parametric CAD solid model; "className", which returns the class name of "PWModel"; "nextFeature", which reads the position of the next segment model feature in the input file; "readFeature", which reads the data for the next segment model feature in the input file; and "numFeatures", which returns the number of segment model features in the input file.

The second class 260 in the diagram of FIG. 10 is labeled "PWMInputFile". This class 260 is the input file for the PWMODEL program. The input file consists of a number of standardized segment model features, each feature having a number of update commands associated with it. The attributes of this class include: "fileSpec", which is the input file absolute path name; "inputFile", which is the input file stream associated with the input file; and "status", which is the error status of "PWMInputFile". The methods of this class include: "className", which returns the class name of "PWMInputFile"; "nextFeature", which reads the position of the next segment model feature in the input file; and "readFeature", which reads the data for the next segment model feature in the input file.

The third class 262 in the diagram of FIG. 10 is labeled "Feature". This class 262 is the main component contained in the "PWMInputFile" class. This class contains all the information for a segment model feature and a list of update commands for that feature. The attributes for this class include: "name", which is the feature name obtained from the input file; "operation", which is the model Boolean operation or command obtained from the input file (e.g., "unite", "intersect" or "subtract"); and "position", which is the current input file position for the segment model feature. There are no methods associated with this class.

The fourth class 264 in the diagram of FIG. 10 is labeled "Command", which comprises an update string consisting of a left-hand side, an equals sign, and a right-hand side. This command is read from the input file for a segment model feature and is used to update the feature once it becomes a part of the parametric model. The attributes of this class include: "commandstr", which is the command string obtained from the input file; "lhsStr", which is the left-hand side of the command string separated by an equals sign; and "rhsStr", which is the right-hand side of the command string separated by an equals sign. There are no methods associated with this class.

The fifth class 266 in the object model diagram is labeled "PWModelServer". This class 266 is responsible for creating the parametric model for the CAD system being used (in this embodiment, the Unigraphics CAD system). This is an abstract class from which CAD system specific servers will inherit. The attributes of this class include: "basePartSpec", which is the file specification for the base format part (i.e., the outer air seal segment) that is obtained from the PWMODEL_BASE_PART environment variable; and "status", which specifies the error status of "PWModelServer". The methods of this class include: "buildModel", which is the abstract method for building the standardized parametric CAD model; and "className", which is the abstract method that returns the class name of the CAD server. The first five classes 258–266 described herein above are essentially independent of the CAD system utilized (i.e., independent of the Unigraphics CAD system). As such, these classes 258–266 may be utilized with any other CAD system.

The sixth class 268 in the diagram of FIG. 10 is labeled "UGModelServer". This class 268 is the CAD system specific server used to construct the standardized parametric solid model of the air seal segment for the Unigraphics CAD system. The "UGModelServer" class inherits from the "PWModelServer" class described above. The attributes of this class include: "base_part_t", which is the part tag obtained upon opening the base format part for the model; "display_part_t", which is the part tag of the currently displayed part; "work_part_t", which is the part tag of the current work part; "layer_status", which is an array containing the layer status of the format part before the standardized Unigraphics library features are added (the status being restored upon completion of the model); and "eng_geometry", which is an array that indicates the geometry part layers that may be used for standardized feature creation. The methods associated with this class include: "buildModel", which constructs the standardized parametric solid model for the Unigraphics CAD system; "initialize", which performs initialization for the CAD system such as opening the base part for parametric model creation; "restoreSession", which restores the status of all layers in the base part once the parametric model has been constructed; "saveSession", which saves the current display and work part as well as the status of all layers before the parametric model is constructed; "seqString(seqno:int)", which creates a part sequence string to be used in updating the features; and "solidTag(group:tag_t)", which locates a solid tag from a group of objects.

The seventh model 270 in the object model diagram is labeled "UGModel". This model is an abstract Unigraphics parametric model class to be inherited from for creating various types of Unigraphics parametric solid models. The attributes associated with this class include: "baseFeatureDir", which specifies the file for the location of the standardized feature parts (it is obtained from the PWMODEL_FEATURE_DIR environment variable); and "status", which specifies the error status of the Unigraphics parametric model. The methods associated with this class include: "addFeature", which adds a new feature to the Unigraphics parametric model; "addFeaturePart", which adds the new feature part to a list of feature parts for future use; "editExpression", which edits the model expression using the update command from input file; "featureDir", which is an abstract method for Unigraphics parametric models to return the directory for obtaining the standardized features for the parametric model; "operations", which performs a "unite", "intersect" or "subtract" Boolean operation for the added feature; "rhsSeqStr", which locates left hand string of string in right hand string and appends sequence string to location; and "updateFeature", which cycles through update commands and update added feature. The sixth and seventh classes 268, 270 described herein above are specific to the Unigraphics CAD system. State diagrams are described and illustrated hereinafter for the "addFeature" and "updateFeature" methods. Also, a state diagram is described and illustrated hereinafter for the "UGModel" class.

The eighth class 272 in the diagram of FIG. 10 is labeled "BOASModel". This class 272 is the Blade Outer Air Seal ("BOAS") parametric Unigraphics solid model. The "BOASModel" class 272 inherits from the "UGModel" class 270. The attribute associated with this class is "featureDirName", which specifies the model type specific directory name containing the BOAS features. The methods associated with this class include: "className", which returns the class name of BOASModel; and "featureDir", which is the compete file specification for the BOAS feature directory. This class 270 is specific to the part whose model is being created (e.g., the outer air seal segment).

The ninth and final class 274 in the object model diagram of FIG. 10 is labeled "UGFeaturePart". This class is a Unigraphics part file associated with the feature added to the parametric model. The attributes associated with this class include: "destCsys", which is a matrix array representing the destination coordinate system for the feature part; "destPoint", which is an array containing the 3D destination point for the feature part; "fileSpec", which is the complete file specification for obtaining the Unigraphics feature part; "group_t", which is the group tag of the added feature part; "layerMode", which specifies the layer mode for the Unigraphics feature part (work or original layer); "scale", which specifies the scale of the feature part; and "status", which specifies the error status of "UGFeaturePart". The methods associated with this class include: "className", which returns the class name of UGFeaturePart; and "import", which is the method of incorporating the Unigraphics part as an added model feature. This ninth and final class 274 is specific to the CAD system being utilized (similar to the sixth and seventh classes described above).

Figure 11:
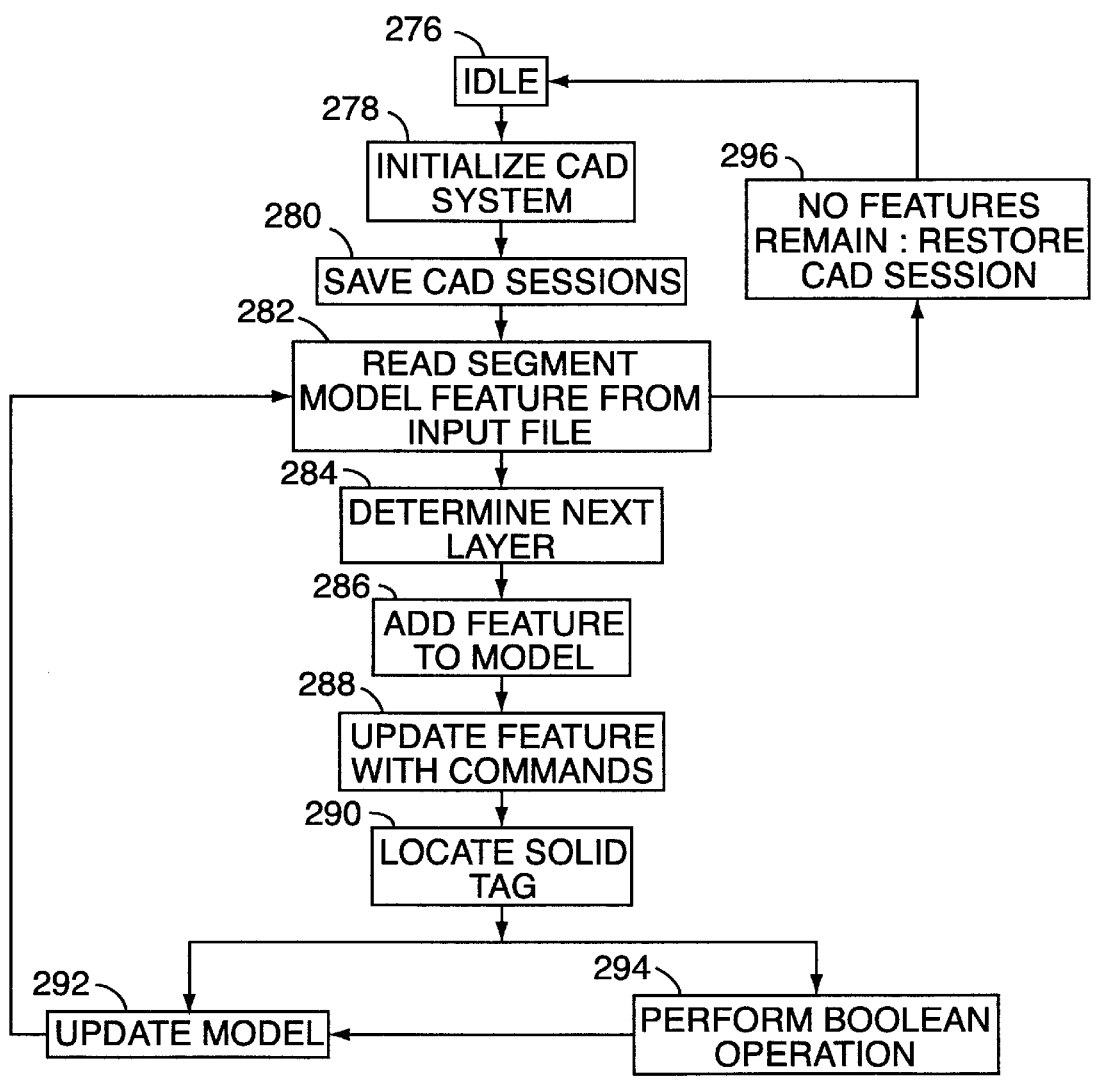
FIG. 11 is a state diagram of one of the classes of the object model diagram of FIG. 10.

FIG. 11 is a state diagram for the "UGModelServer" class 268 described above in conjunction with the object model diagram of FIG. 10. This class 268 is responsible for building the standardized parametric model of the outer air seal segment 100 in the Unigraphics CAD system. FIG. 11 illustrates the various states that "UGModelServer" 268 transitions through in building the parametric model of the outer air seal segment.

Initially, PWMODEL is idle in a state 276. The "UGModelServer" class 268 begins execution when a request is sent to that class 268 to build a standardized parametric solid model of the outer air seal. The class 268 then transitions to a state 278 in which the Unigraphics CAD system is initialized. This initialization consists of opening the base format part in which the parametric model will be constructed. When initialization has been completed, the current CAD session parameters are saved in a state 280. This enables the current settings to be restored when the model construction has been completed.

PWMODEL then transitions into a state 282 in which each segment model feature must be read from the input file. Once a feature has been read, PWMODEL transitions into a state 284 that determines the layer in which the feature should be placed on. The feature is then added to the model in a state 286. PWMODEL then transitions into a state 288 where the update commands from the input file are used to dynamically update the model. This dynamic update consists of setting the expressions associated with the feature with the values obtained from the input file.

Now that the feature has been added to the model and updated, PWMODEL transitions into a state 290 in which the solid part, or "tag", of the feature is searched for and the specified Boolean operation is performed between the feature and the parametric model. The Boolean operation for the feature is read from the input file and can be one of three values: "unite", "intersect" or "subtract". Instead, if the operation is "import", PWMODEL transitions into a state 292 in which the model is updated. PWMODEL then branches back to the state 282 in which the next feature, if any are remaining, is read. Generally, the first feature in an input file must have an "import" Boolean operation.

Instead, if the Boolean operation is "unite", "intersect" or "subtract", PWMODEL transitions into a state 294 in which that Boolean operation is performed with the parametric model to form a new parametric solid model. PWMODEL then branches to the state 292 in which the model is updated.

PWMODEL then branches into the state 282 in which the next feature, if any are remaining, is read from the input file. Once all features have been added and updated, and the specified operation has been performed, the CAD session is restored in a state 296, and PWMODEL then transitions into the idle state 276.

Figure 12:
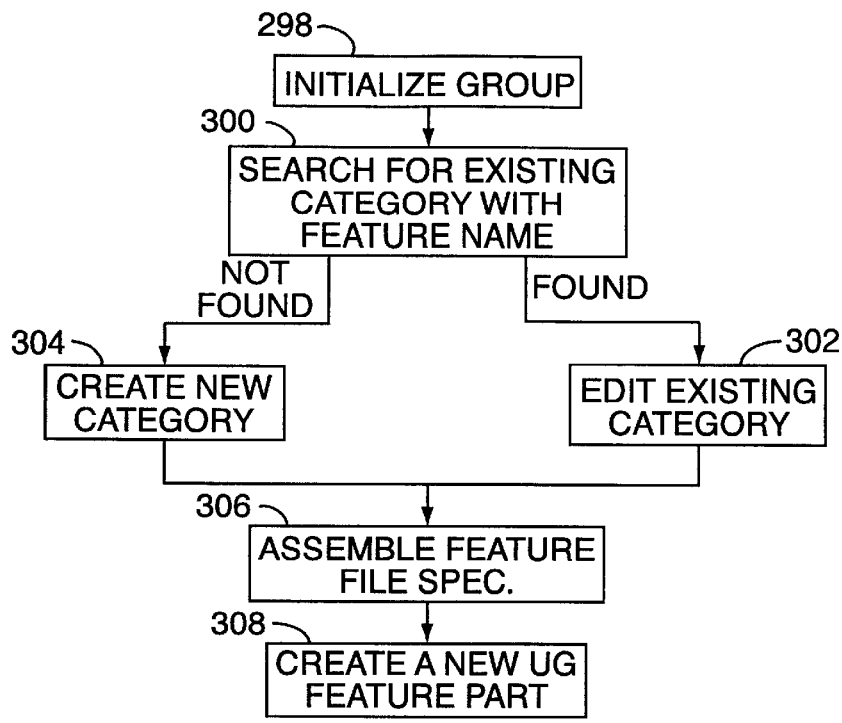
FIG. 12 is a state diagram of one of the methods of the class illustrated in the state diagram of FIG. 11.

Referring to FIG. 12, there illustrated is a state diagram of the "addFeature" method within the "UGModel" class 270 of FIG. 10. This method is also a state within the state diagram of FIG. 11 of the "UGModelServer" class 268 of FIG. 10. Thus, FIG. 12 depicts a "nested" state diagram of one of two important tasks performed in "UGModel": that of adding a feature to the model with the commands from the input file from the product model software program of FIG. 2. The nested state diagram of FIG. 12 illustrates the states that are transitioned through in order to add a feature to the parametric solid model.

After entering the state diagram of FIG. 12, PWMODEL enters a state 298 in which an initialization is performed to set the group tag of the feature added to empty. PWMODEL then enters a state 300 in which a search is initiated to locate an existing category with the name of the feature to be added. If a category currently exists, then PWMODEL enters a state 302 in which the layer of the feature to be added is set to become part of the located category. However, if a category with the feature name is not found, then PWMODEL enters a state 304 in which a new category with the feature's name is created.

Once the category for the feature name is in place, PWMODEL enters a state 306 in which the directory specification that points to the feature's location is constructed or assembled. PWMODEL then enters a state 308 in which a new Unigraphics feature part is created. The "UGFeaturePart" class 274 of FIG. 10 is responsible for importing the feature into the current CAD base part. PWMODEL then exits the state diagram of FIG. 12.

Figure 13:
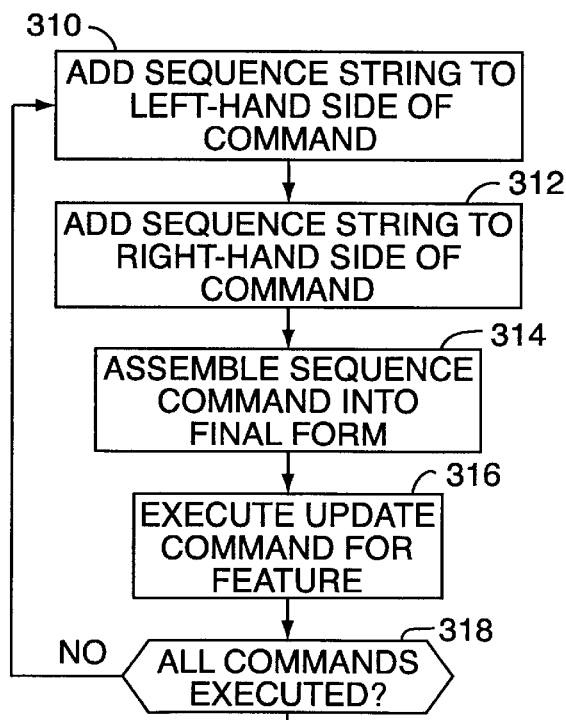
FIG. 13 is a state diagram of a second one of the methods of the class illustrated in the state diagram of FIG. 11.

FIG. 13 is a second nested state diagram that illustrates the various states that PWMODEL transitions through in updating features added to a parametric solid model. Similar to the "addFeature" method within the "UGModel" class 270 of FIG. 10, "UpdateFeature" is also a method within the "UGModel" class of FIG. 10. In general, the update is performed by reading a series of commands from the input file associated with the feature. Then, operations necessary to update the feature are performed. The command that is read from the input file must be sequenced properly before it can be processed to update the feature. In Unigraphics, when a part is imported, the part is assigned a sequence number that uniquely identifies that part.

Specifically, when entering the state diagram of FIG. 13, PWMODEL enters a state 310 where it adds the sequence number to the left-hand side of the command. Next, PWMODEL enters a state 312 where it adds the sequence number to the right-hand side of the command. PWMODEL then enters a state 314 where it assembles the sequenced command into its final form. A sequenced command is the update command read from the input file as modified with a sequence number. This takes into account Unigraphics sequencing when a feature part is added to the segment model being created. After the sequenced command is assembled into its final form, the command can be used in a state 316 to update the dynamic parameters of the feature that has been imported into the current CAD part. This cycle continues until all the commands for a feature have been sequenced correctly and then used to update the newly added feature in the current base part. PWMODEL checks in a state 318 if all commands have been sequenced. If not, PWMODEL branches back to the state 310. If all commands have been sequenced, PWMODEL exits the nested state diagram of FIG. 13.

PWMODEL has utility in that, model-wise, it links the knowledge based ICAD system with a Unigraphics CAD system. The ICAD system provides a model configuration that satisfies the design requirement for the segment, while PWMODEL constructs a standardized fully parametric model from a library of air seal segment structural features. The parametric model created by PWMODEL supports various operations within the Unigraphics CAD system that rely on parametric models, such as the master model concept. PWMODEL also accommodates user-defined features that may be added to the model. Thus, parametric segment relationships in the knowledge based ICAD design system can be defined from the design viewpoint, while the parametric relationships in the Unigraphics model can be defined from the manufacturing viewpoint.

Although the present invention has been shown and described with respect to the detailed embodiments thereof, it will be understood by those skilled in the art that various changes in the form and detail thereof may be made without departing from the broadest scope of the claimed invention.

Having thus described the invention, what is claimed is:

1. A method of creating a model of an outer air seal for a gas turbine engine, comprising the steps of:
creating a knowledge base of information having a plurality of rules with respect to a corresponding plurality of parameters of associated elements of a segment of the outer air seal, wherein the knowledge base comprises at least one data value for each one of the plurality of rules;
entering a desired data value for a selected one of the plurality of parameters of an associated element of the outer air seal segment;
comparing the entered desired data value for the selected one of the plurality of parameters with the corresponding at least one data value in the knowledge base for the corresponding one of the plurality of rules;
if the result of the step of comparing is such that the entered desired data value for the selected one of the plurality of parameters is determined to have a first predetermined relationship with respect to the corresponding at least one data value in the knowledge base for the selected one of the plurality of rules, then creating a geometric representation of the selected one of the plurality of parameters of the associated element of the outer air seal segment;
analyzing the created geometric representation of the selected one of the plurality of parameters of the associated segment of the outer air seal; and
performing a durability analysis on the created geometric representation of the selected one of the plurality of parameters of the associated segment of the outer air seal.

2. The method of claim 1, wherein the step of creating a geometric representation of the selected one of the plurality of parameters of the associated element of the outer air seal segment further comprises the step of updating the model of the outer air seal segment with the selected one of the plurality of parameters of the associated element of the outer air seal segment.

3. The method of claim 1, wherein if the result of the step of comparing is such that the entered desired data value for the selected one of the plurality of parameters is determined to have a second predetermined relationship with respect to the corresponding at least one data value in the knowledge base for the selected one of the plurality of rules, then modifying the entered desired data value for the selected one of the plurality of parameters.

4. The method of claim 3, further comprising the steps of:
comparing the modified data value for the selected one of the plurality of parameters with the corresponding at least one data value in the knowledge base for the corresponding one of the plurality of rules; and
if the result of the step of comparing the modified data value is such that the modified data value for the selected one of the plurality of parameters is determined to be of the first predetermined relationship with respect to the corresponding at least one data value in the knowledge base for the selected one of the plurality of rules, then creating a geometric representation of the selected one of the plurality of parameters of the associated element of the outer air seal segment.

5. The method of claim 1, further comprising the step storing the created knowledge base of information.

6. The method of claim 1, further comprising the step of displaying the created geometric representation of the selected one of the plurality of parameters of the associated element of the outer air seal segment.

7. The method of claim 1, wherein the associated elements of the segment of the outer air seal include a means for sealing adjacent segments together.

8. The method of claim 1, wherein the associated elements of the segment of the outer air seal include a means for attaching adjacent segments together.

9. The method of claim 1, wherein the associated elements of the segment of the outer air seal include a means for cooling the segment.

10. The method of claim 1, wherein the at least one data value for each of the plurality of rules in the knowledge base comprises a numerical value.

11. The method of claim 1, wherein the at least one data value for each of the plurality of rules in the knowledge base comprises a range of values.

12. The method of claim 1, wherein the step of entering a desired data value for a selected one of the plurality of parameters of an associated element of the outer air seal segment comprises the steps of:
making available at least one data value for each one of the plurality of parameters of the associated element of the outer air seal segment; and
selecting a desired data value for the selected one of the plurality of parameters of the associated element of the outer air seal segment from the made available at least one data value for each one of the plurality of parameters of the associated element of the outer air seal segment.

13. The method of claim 12, wherein the step of making available at least one data value for each one of the plurality of parameters of the associated element of the outer air seal segment comprises the step of providing a visual display containing a graphic depiction of the at least one data value for each one of the plurality of parameters of the associated element of the outer air seal segment.

14. A method of creating a model of an outer air seal for a gas turbine engine, comprising the steps of:
creating a knowledge base of information having a plurality of rules with respect to a corresponding plurality of parameters of associated elements of a segment of the outer air seal, wherein the knowledge base comprises at least one data value for each one of the plurality of rules;

entering a desired data value for a selected one of the plurality of parameters of an associated element of the outer air seal segment;

comparing the entered desired data value for the selected one of the plurality of parameters with the corresponding at least one data value in the knowledge base for the corresponding one of the plurality of rules;

if the result of the step of comparing is such that the entered desired data value for the selected one of the plurality of parameters is determined to have a first predetermined relationship with respect to the corresponding at least one data value in the knowledge base for the selected one of the plurality of rules, then creating a geometric representation of the selected one of the plurality of parameters of the associated element of the outer air seal segment; and providing a file listing of a selected one or more of the plurality of parameters of the associated segment of the outer air seal, wherein the file listing includes at least one of the entered data values for each one of the corresponding plurality of parameters of the outer air seal segment, wherein the file listing represents a parametrical listing of each element of the model of the outer air seal segment.

15. The method of claim 14, wherein the step of providing a file listing of a selected one or more of the plurality of parameters of the associated segment of the outer air seal further comprises the step of providing the file listing as an output from a knowledge-based engineering system.

16. The method of claim 14 wherein the step of creating a geometric representation of the selected one of the plurality of parameters of the associated element of the outer air seal segment further comprises the step of updating the model of the outer air seal segment with the selected one of the plurality of parameters of the associated element of the outer air seal segment.

17. The method of claim 14 wherein if the result of the step of comparing is such that the entered desired data value for the selected one of the plurality of parameters is determined to have a second predetermined relationship with respect to the corresponding at least one data value in the knowledge base for the selected one of the plurality of rules, then modifying the entered desired data value for the selected one of the plurality of parameters.

18. The method of claim 17, further comprising the steps of comparing the modified data value for the selected one of the plurality of parameters with the corresponding at least one data value in the knowledge base for the corresponding one of the plurality of rules; and if the result of the step of comparing the modified data value is such that the modified data value for the selected one of the plurality of parameters is determined to be of the first predetermined relationship with respect to the corresponding at least one data value in the knowledge base for the selected one of the plurality of rules, then creating a geometric representation of the selected one of the plurality of parameters of the associated element of the outer air seal segment.

19. The method of claim 14, further comprising the step storing the created knowledge base of information.

20. The method of claim 14, further comprising the step of displaying the created geometric representation of the selected one of the plurality of parameters of the associated element of the outer air seal segment.

21. The method of claim 14, wherein the associated elements of the segment of the outer air seal include a means for sealing adjacent segments together.

22. The method of claim 14, wherein the associated elements of the segment of the outer air seal include a means for attaching adjacent segments together.

23. The method of claim 14, wherein the associated elements of the segment of the outer air seal include a means for cooling the segment.

24. The method of claim 14, wherein the at least one data value for each of the plurality of rules in the knowledge base comprises a numerical value.

25. The method of claim 14, wherein the at least one data value for each of the plurality of rules in the knowledge base comprises a range of values.

26. The method of claim 14, wherein the step of entering a desired data value for a selected one of the plurality of parameters of an associated element of the outer air seal segment comprises the steps of:

making available at least one data value for each one of the plurality of parameters of the associated element of the outer air seal segment; and selecting a desired data value for the selected one of the plurality of parameters of the associated element of the outer air seal segment from the made available at least one data value for each one of the plurality of parameters of the associated element of the outer air seal segment.

27. The method of claim 26, wherein the step of making available at least one data value for each one of the plurality of parameters of the associated element of the outer air seal segment comprises the step of providing a visual display containing a graphic depiction of the at least one data value for each one of the plurality of parameters of the associated element of the outer air seal segment.

28. A method of creating a model of an outer air seal for a gas turbine engine, comprising the steps of:

creating a knowledge base of information having a plurality of rules with respect to a corresponding plurality of parameters of associated elements of a segment of the outer air seal, wherein the knowledge base comprises at least one data value for each one of the plurality of rules;

entering a desired data value for a selected one of the plurality of parameters of an associated element of the outer air seal segment;

comparing the entered desired data value for the selected one of the plurality of parameters with the corresponding at least one data value in the knowledge base for the corresponding one of the plurality of rules;

if the result of the step of comparing is such that the entered desired data value for the selected one of the plurality of parameters is determined to have a first predetermined relationship with respect to the corresponding at least one data value in the knowledge base for the selected one of the plurality of rules, then creating a geometric representation of the selected one of the plurality of parameters of the associated element of the outer air seal segment;

wherein the method further comprises the step of providing a file listing of a selected one or more of the plurality of parameters of the associated segment of the outer air seal, wherein the file listing includes at least one of the entered desired data values for each one of the corresponding plurality of parameters of the outer air seal segment, wherein the file listing represents a parametrical listing of each element of the model of the outer air seal segment;

wherein the step of providing a file listing of a selected one or more of the plurality of parameters of the associated segment of the outer air seal further comprises the step of providing the file listing as an output from a knowledge-based engineering system;

wherein the method further comprises the steps of:

iteratively reading each one of the plurality of parameters from the file listing; and for each step of iteratively reading each one of the plurality of parameters from the file listing, updating a model of the outer air seal segment in a computer aided design system.

29. The method of claim 28, wherein the file listing further includes at least one operation that corresponds to each one of the plurality of parameters in the file listing, wherein each one of the operations is an operation to be performed on the corresponding one of the plurality of parameters in the file listing to update the model of the outer air seal segment in the computer aided design system.

30. The method of claim 29, wherein the step of updating the model of the outer air seal segment in the computer aided design system comprises the step of performing a Boolean operation that comprises at least one of three commands, a first one of the three commands being a command that unites an element with the model, a second one of three commands being a command that subtracts an element from the model, a third one of the three commands being a command that intersects an element with the model.

* * * * *